United States Patent
Yoshinaga et al.

[11] Patent Number: 5,952,629
[45] Date of Patent: Sep. 14, 1999

[54] SWITCH APPARATUS

[75] Inventors: Kenichi Yoshinaga; Takamichi Masubuchi, both of Shizuoka-ken, Japan

[73] Assignee: Yamaha Corporation, Hamamatsu, Japan

[21] Appl. No.: 08/571,492

[22] Filed: Dec. 13, 1995

[30] Foreign Application Priority Data

Dec. 28, 1994 [JP] Japan ................................ 6-327803
Apr. 28, 1995 [JP] Japan ................................ 7-105681

[51] Int. Cl.⁶ .................................................. H01H 1/14
[52] U.S. Cl. ........................ 200/5 A; 200/1 B; 200/512; 200/275
[58] Field of Search .................... 200/5 R, 5 A, 200/512–517, 275, 141 B

[56] References Cited

U.S. PATENT DOCUMENTS

| | | | |
|---|---|---|---|
| 3,916,360 | 10/1975 | Pedersen et al. | 335/205 |
| 4,652,704 | 3/1987 | Franklin | 200/5 A |
| 4,659,881 | 4/1987 | Dowe | 200/5 R |
| 4,668,843 | 5/1987 | Watanabe et al. | 200/5 A |
| 4,987,275 | 1/1991 | Miller eta l. | 200/5 A |
| 5,453,571 | 9/1995 | Adachi et al. | 84/658 |
| 5,510,584 | 4/1996 | Norris | 200/5 A |
| 5,559,311 | 9/1996 | Gorbartoff | 200/513 |

FOREIGN PATENT DOCUMENTS

| | | | |
|---|---|---|---|
| 3-112019 | of 0000 | Japan . | |
| 6335993 | 2/1983 | Japan | G10H 1/34 |
| 883914 | 4/1988 | Japan . | |
| 4146496 | 5/1992 | Japan | G10H 1/34 |
| 485538 | 7/1992 | Japan | H01H 13/52 |
| 6-176663 | 6/1994 | Japan | H01H 21/00 |
| 6-203700 | 7/1994 | Japan | H01H 21/00 |

*Primary Examiner*—Cassandra C. Spirou
*Assistant Examiner*—Michael A. Friedhofer
*Attorney, Agent, or Firm*—Pillsbury, Madison & Sutro LLP

[57] ABSTRACT

A switch apparatus has a fixed contact including a contact pattern formed on a printed substrate and a movable contact provided above and opposing the fixed contact. A switching operation is performed by engaging the movable contact with the fixed contact. The fixed contact pattern has a first pair of fixed contacts and a second pair of fixed contacts. The fixed contact patterns are separated by a predetermined distance from one another. The movable contact has a first movable contact and a second movable contact for engagement with the first and the second pairs of fixed contacts, respectively. One of the first pair of fixed contacts and one of the second pair of fixed contacts are formed in a unit to define a common pattern. Only the common pattern is disposed between the other of the first pair of fixed contacts and the other of the second pair of fixed contacts.

33 Claims, 12 Drawing Sheets

FIG. 1 (A)     FIG. 1 (B)
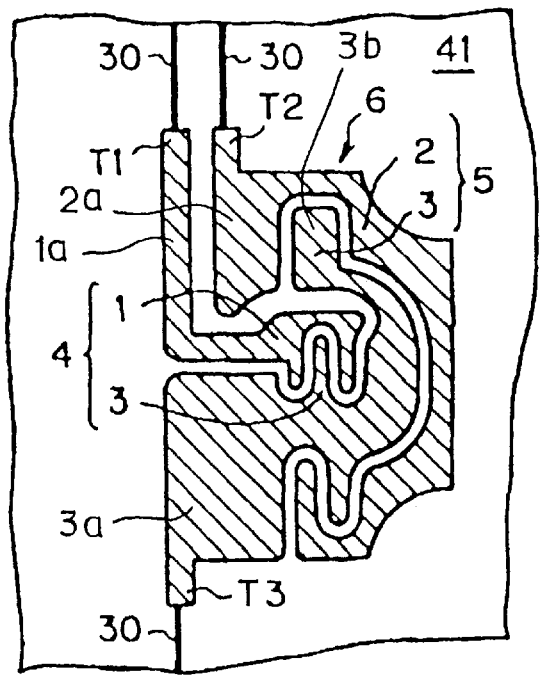 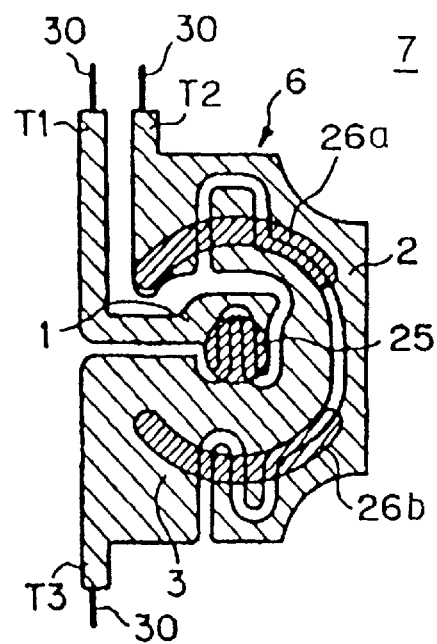
FIG. 2
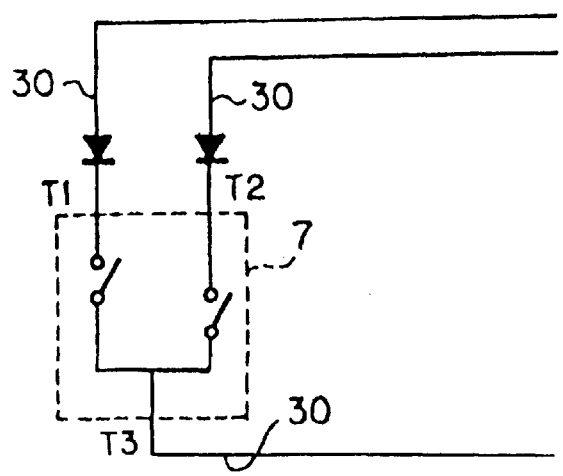

F I G. 1 1 (A)
(PRIOR ART)
F I G. 1 1 (B)
(PRIOR ART)
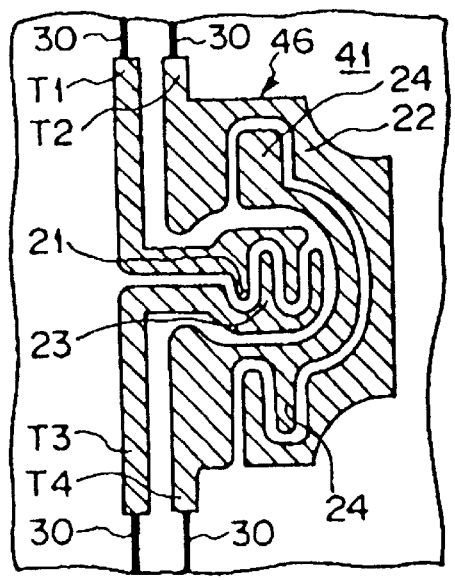
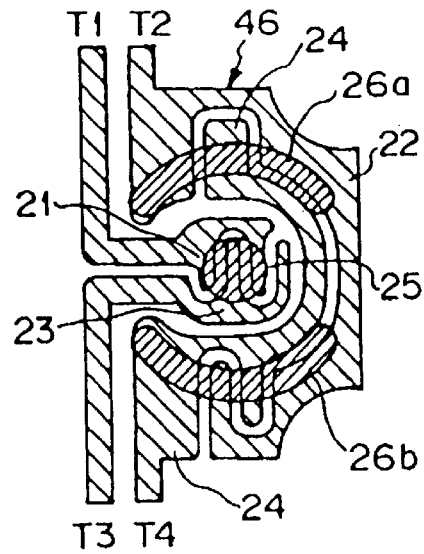
F I G. 1 2 (PRIOR ART)
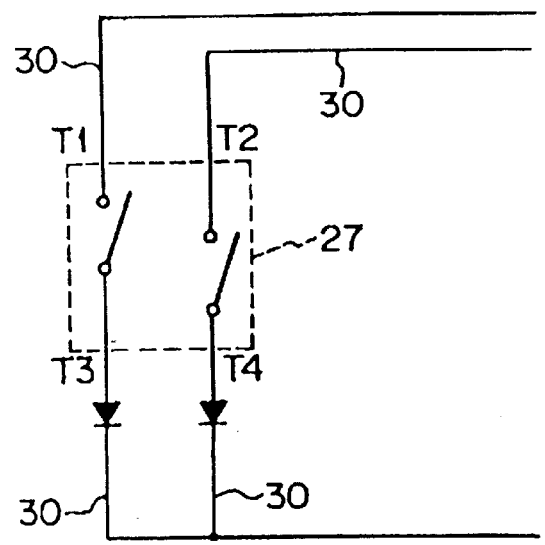

FIG. 13 (A) (PRIOR ART)
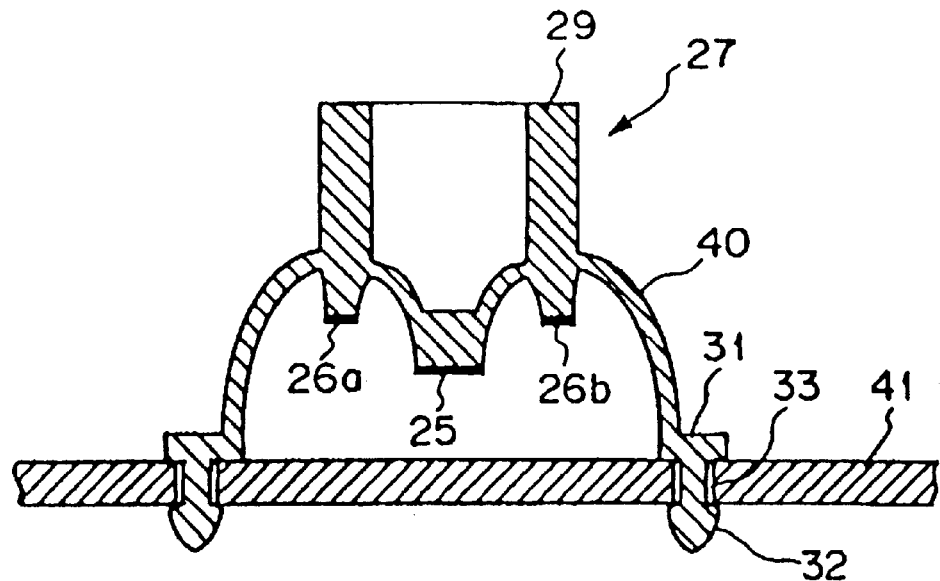
FIG. 13 (B) (PRIOR ART)
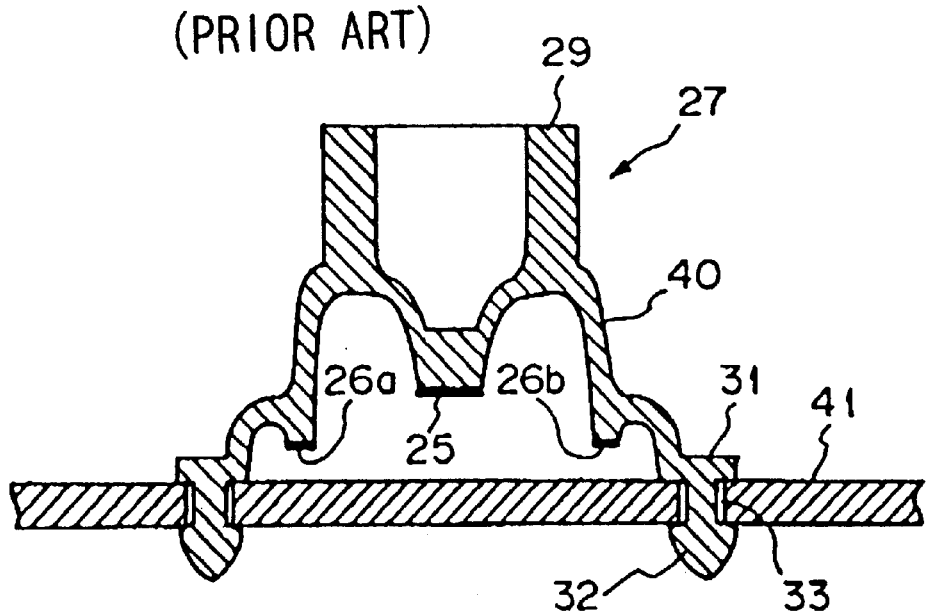

SWITCH APPARATUS

BACKGROUND OF THE INVENTION

1. Field of the Invention

Embodiments of the present invention relate to a switch apparatus, and more particularly to a switch apparatus in which a plurality of pairs of contacts are closed or opened individually from one another or in a predetermined relation with one another.

2. Description of Related Art

There are a variety of switch apparatuses for electronic equipments. A type of switch apparatus for an electronic equipment has a plurality of switches disposed adjacent to one another. For example, a set of two keys, namely, up and down keys may be used to input numerical values. In general, the two up and down keys are closely located from each other for practical reasons. Since a set of up and down keys is relatively compact for imputing numerical values, as compared with, for example, a ten-key, the set of up and down keys is used for relatively small sized equipment. However, there is a limitation as to how closely the two keys can be located when the equipment is substantially small, such as a wrist watch, in spite of the fact that there are great demands to more closely locate the two keys to one another.

Also, in the field of electronic musical instruments, a multiple-make (for example, two-make) touch response switch has been used for many years. The multiple-make touch response switch has a plurality of fixed contacts and associated movable contacts. By depressing the switch, the plurality of fixed contacts are successively closed by the movable contacts with a time difference that varies depending on the speed of switch depression. For example, a two-make switch has two fixed contacts and two movable contacts. When the switch is depressed, the two fixed contacts are successively closed by the associated movable contacts with a time difference that varies depending on the speed of switch depression.

In such multiple-make switches, the contacts (including both fixed contacts and movable contacts) are located closely to one another. However, any one of the movable contacts should not affect the other movable contacts to achieve a normal switch function of the switch as a whole, even if the switch device is of relatively rough manufacture.

From a functional view point, the structure of the above mentioned two-key switch device allows a pair of switches to turn on and off independently at different specified timings. On the other hand, the structure of the multiple-make switch allows the contacts to turn on and off in a specified relation (a first switch makes contact, and then a second switch makes contact) in association with the switch depression.

In both cases, regardless of the presence or the absence of such a relationship, the requirements are to improve the technology to allow further miniaturization of a switch device that is functional even if the switch is of relatively rough manufacture.

A multiple-make touch response switch, for example, a two-make touch response switch, has a fixed contact and a corresponding movable contact associated with the fixed contact. The fixed contact includes a fixed contact pattern formed on a printed substrate and the movable contact is disposed above and opposing the fixed contact. The movable contact is brought into contact with the fixed contact to perform a switching operation.

FIG. 11 shows part of a prior art two-make switch. FIG. 11 (A) shows a pattern of a fixed contact 46 fromed on a printed substrate 41. FIG. 11 (B) shows a movable contact that is into contact with the fixed contact 46. The fixed contact 46 has two pairs of fixed contact patterns, namely an internal pair of internal patterns 21 and 23, and an external pair of external patterns 22 and 24. Each of the patterns is separated by a specified distance from one another and has a relatively complicated shape as shown in FIG. 11. The patterns 21, 22, 23 and 24 have contact terminals T1, T2, T3 and T4, respectively, formed at their respective terminal ends that connect to an external wiring pattern 30 that is provided external to the switch.

On the other hand, a first movable contact 25 and second movable contacts 26a and 26b are formed above and opposing the fixed contact 46. The first movable contact 25 is provided at a location where the first movable contact 25 comes in contact with end sections of the internal pair to conductively connect the internal patterns 21 and 23. Each of the second movable contacts 26a and 26b is made in the form of an arc, and provided at a location where the movable contacts 26a and 26b connect the external patterns 22 and 24, but do not come in contact with the internal patterns 21 and 23.

The two-make switch of this type is mounted, for example, on each key of an electronic keyboard apparatus to generate a key-on signal or a key depression speed signal in association with the key depression operation.

FIG. 12 shows a circuit diagram of a conventional two-make switch of the type described above. A contact section (the two-make switch) 27 is formed from the fixed contact and the movable contact described above. The contact section 27 includes the four contact terminals T1, T2, T3 and T4. The four contact terminals are connected through, for example, diodes, to four wiring patterns 30 that are formed on a printed substrate external to the switch. Each of the wiring patterns 30 is connected to a CPU (not shown) that is used for generating electronic sound and controlling the timbre, the loudness and other parameters of the musical sound in response to the key depression operation.

FIG. 13 shows two types of two-make switches in cross-section. FIG. 13 (A) shows a two-make switch in which the first movable contact 25 makes first contact with the fixed contact. FIG. 13 (B) shows another two-make switch in which the second contact 26a and 26b make first contact with the fixed contact. The movable contact of the two-make switch 27 is made of an elastic material, such as rubber, a polymeric material, and the like. The movable contact has a depression section 29 formed at its top, a dome-shaped or a cup-shaped elastic deformation section 40, and an edge section 31 along its lower periphery. At the central area within the elastic deformation section 40, there is provided the first movable contact 25 in the form of a circle that is made of a conductive material, and the second movable contacts 26a and 26b in the form of an arc about the first movable contact 25. An elastic protrusion 32 is formed at the lower surface of the edge section 13. The elastic protrusion 32 is pushed through an aperture 33 formed in the printed substrate 41 to fix the switch 27 to the printed substrate 41.

In the switch structure shown in FIG. 13 (A), when the depression section 29 is pressed down, the elastic deformation section 40 deforms itself. As a result, the first movable contact 25 at the center comes in contact with the internal patterns 21 and 23 (see FIG. 11) of the fixed contact formed on the printed substrate 41, and the internal patterns 21 and 23 are conductively connected to each other. By further pressing down the depression section 29, the arc-shaped second movable contacts 26a and 26b come in contact with the external patterns 22 and 24 (see FIG. 11). As a result, the external patterns 22 and 24 are conductively connected to each other. As a consequence, the switch makes contact in two different stages at different timings. In contrast, in accordance with the switch structure shown in FIG. 13 (B), the external second movable contacts 26a and 26b first come in contact with the associated external fixed contacts, and then the first movable contact 25 at the center comes in contact with the associated fixed contacts.

A structure of a typical conventional electronic keyboard apparatus is described in Japanese laid-open patent application HEI 6-176663. The electronic keyboard apparatus shown in this reference has a switch device that is formed from a pair of a movable contacts and a fixed contact for each key. A switch apparatus that is mounted in an electronic keyboard apparatus typically has a structure shown in FIG. 14 or FIG. 15.

As shown in FIG. 14, a two-make switch 50 has a first movable contact 51 and a second movable contact 52, and is mounted on a printed substrate 53. A first fixed contact 54 and a second fixed contact 55 in a comb-teeth pattern are formed on the printed substrate 53 as shown in FIG. 14. The fixed contact 54 is formed from a pair of oppositely engaging comb-teeth patterns 54a and 54b, and the fixed contact 55 is formed from a pair of oppositely engaging comb-teeth patterns 55a and 55b. Each of the comb-teeth shaped fixed contacts 54 and 55 is disposed with ends of the comb patterns being opposed each other. The first and second fixed contacts 54 and 55 are disposed adjacent to each other in a direction in which the comb teeth are arranged. The first and second movable contacts 51 and 52 come in contact with the first and the second fixed contacts 54 and 55, respectively, with a time difference, in a similar manner as the switch structure shown above in FIGS. 11 through 13

In the prior art example shown in FIG. 15, a first fixed contact 54 has a pair of oppositely engaging comb-teeth patterns 54a and 54b, and a second fixed contact 55 has a pair of oppositely engaging comb-teeth patterns 55a and 55b, in a similar manner as the above example shown in FIG. 14. In this example, the fixed contacts 54 and 55 are disposed adjacent and in parallel with each other on a printed substrate in the direction in which the comb teeth are arranged. By this particular structure, the first and second movable contacts 51 and 52 come in contact with the first and the second fixed contacts 54 and 55, respectively, with a time difference, in a similar manner as the above described prior art example.

Switches that successively make contact with a time difference include, for example, a touch response switch that detects key touches in an electronic musical instrument. A typical touch response switch includes a two-make switch. The touch response switch detects the movement of a depressed key based on a time difference between two contacts provided by the two-make switch, computes the key depression speed or the key depression force based on the key depression acceleration, and controls various musical sounds based on these parameters.

On the other hand, a switch apparatus having a plurality of pairs of contacts may be used in a manner other than as a touch response switch in which plural contacts are successively made with a time difference as described above. For example, each of the pairs is provided with two movable contacts having the same height so that the two movable contacts simultaneously come in contact with the associated fixed contact so that each pair functions as an independent switch.

However, in the conventional two-make switches shown in FIGS. 11 through 13, the fixed contact patterns 21, 22, 23 and 24 have the four independent contact terminals T1, T2, T3 and T4. As a result, the manufacture is complicated because the patterns are complicated and thus a fine patterning with a high printing resolution is required. In addition, there are manufacturing limitations in narrowing a separation between adjacent patterns. As a result, a small switch apparatus cannot be manufactured.

Furthermore, a conventional two-make switch may be provided at each key of an electronic keyboard instrument in a manner such that the switch is operated by the key depression operation of each key. Generally, keys of a keyboard instrument are disposed in a manner that each key rotates about one of its ends which acts as a fulcrum, and the switch is disposed in a manner such that the key pushes down the switch by a central area of a lower side of the key as the key is rotated about its fulcrum. As a result, the key does not provide a depression force in a linear, vertical direction with respect to the switch and thus pushes the switch in the course of its rotational movement. As a consequence, the movable contact comes in contact with the fixed contact as the switch is bent and re-bent. Therefore the movement of the movable contact is not stable. As a result, there are occasions in which the first movable contact, that has been in contact with the fixed contact, may separate from the fixed contact when the second movable contact comes in contact with the associated fixed contact pattern, which causes the switch to chatter. As a consequence, where the switch is used as a key touch response detector, sounds are not correctly controlled because correct information of a contact time difference between the two movable contacts is not provided by the switch.

Even if the keyboard structure is modified in a manner that the keys move in the vertical direction, the problem of the switch chattering is not solved. When a key is struck with a strong force, the first movable contact may generate vibrations due to its mass, which may separate the first movable contact from the fixed contact when the second movable contact makes contact with the associated fixed contact.

The above described problems of the prior art technology may occur in the switch structures shown in FIG. 14 and FIG. 15. It is noted that the structures of the prior art switches shown in FIGS. 14 and 15 are exaggerated. More particularly, the contacts 54 and 55 are spaced a greater distance from each other than they are shown in FIGS. 14 and 15. In the prior art structure, the comb-shaped fixed contacts 54 and 55 are disposed as closely as possible from each other to miniaturize the switch. However, for the switch to properly function, the movable contacts are to be positioned with respect to the associated fixed contacts within allowable ranges of S1 and S2 shown in FIG. 14 and FIG. 15 so that each of the movable contacts (for example, the movable contact 52) does not contact a fixed contact (the fixed contact 54) next to the respective associated fixed contact (the fixed contact 55). The allowable ranges are determined by a pitch width between adjacent patterns that is in return determined by the precision of the printing technology for printing the comb teeth patterns. If the patterns are brought closer to each other beyond the allowable range, short circuits occur, and thus the switching function is ruined.

On the other hand, with respect to the movable contacts, the protrusions (the reference numeral 32 in FIG. 13) are formed at a predetermined pitch on the under side of the base section (the end section 31 in FIG. 13) along the key arrangement direction. The protrusions are pushed through the apertures (the reference numeral 33 in FIG. 13) formed in the printed substrate to fix the movable contact to the printed substrate. In this case, there are occasions in which the movable contact is slightly shifted with respect to the fixed contact due to errors in the position and the size of the apertures. It is noted that the allowable ranges S1 and S2 at the fixed contacts 54 and 55 are also determined by the errors described above. As a result, the allowable ranges become much narrower.

The problems described above are associated not only with the use of a touch response switch that detects the key depression force or speed in a keyboard apparatus, but are also associated with switches in general that are formed from a fixed contact pattern and a movable contact pattern. More particularly, the problems are associated with two-make switches and multiple-make switches. Particularly, in switch apparatuses having a plurality of pairs of fixed contacts and opposing movable contacts in which each of the plurality of pairs independently function as a switch, the switches cannot be made smaller and the switches tend to chatter.

SUMMARY OF THE INVENTION

It is an object of the present invention to provide a switch apparatus which is small in size and has simplified patterns and which can be easily and efficiently manufactured.

It is another object of the present invention to provide a multiple-make switch apparatus having contacts which reduce chatter and do not separate from each other when the switch is depressed.

In accordance with an embodiment of the present invention, a switch apparatus has a fixed contact including a contact pattern formed on a printed substrate and a movable contact provided above and opposing the fixed contact. A switching operation is performed by engaging the movable contact with the fixed contact. In accordance with an embodiment, the fixed contact pattern has a first pair of fixed contacts and a second pair of fixed contacts. The fixed contact patterns are spaced at a predetermined distance from each other. The movable contact has a first movable contact and a second movable contact for engagement with the first and the second pairs of fixed contacts, respectively. One of the first pair of fixed contacts and one of the second pair of fixed contacts are formed in a unit to define a common pattern. Only the common pattern is disposed between the other of the first pair of fixed contacts and the other of the second pair of fixed contacts.

As a result, a fixed contact is formed by small patterns and the number of contact terminals for signal output is reduced. Accordingly, the structure and the patterns are simplified and the manufacture of the switch is facilitated. Also, as a result of providing the common pattern, each of the fixed contact patterns can be made wider for a given movable contact size, compared with the prior art fixed contacts. As a result, the electrical resistance of the patterns is reduced, and thus the reliability of signal detection is enhanced. On the other hand, for a given fixed contact pattern width, the fixed contact pattern can be made smaller, compared with the prior art fixed contact patterns, and the movable contact may be correspondingly. Accordingly, the switch is capable of being further miniaturized.

In accordance with another embodiment of the present invention, the fixed contact pattern has at least a pair of internal patterns to define an internal pair and a pair of external patterns to define an external pair. The patterns of the pairs are spaced apart at a predetermined distance from each other. The movable contact has a first movable contact and a second movable contact corresponding to the internal pair and the external pair, respectively. One of the patterns of the internal pair and one of the patterns of the external pair are formed in a unit to define a common pattern.

Accordingly, the internal pair and the external pair are formed by the three patterns, and therefore the switch has three contact terminals for a signal output, and the structure and the patterns are simplified and the manufacture of the switch is facilitated. Also, by providing the common pattern, the pattern width can be made wider for a movable contact having the same size as the one used with the prior art fixed contact patterns. In a similar manner as described above, each of the fixed contact patterns can be made wider for a given movable contact size, compared with the prior art fixed contacts. As a result, the electrical resistance of the patterns is reduced and thus the reliability of signal detection is enhanced. On the other hand, for a given fixed contact pattern width, the fixed contact pattern can be made smaller, compared with the prior art fixed contact patterns, and the movable contact may also be made smaller, and thus the switch is capable of being further miniaturized.

In accordance with a still another embodiment of the present invention, each of the patterns forming the internal pair and the external pair has a leading section and a contact terminal defining a base section connected to the leading section. The base section is also connected to an external wiring pattern that is external to the switch. In a preferred embodiment, the base section of the common pattern is thicker than the leading section. Accordingly, the electrical resistance is lowered particularly in an area adjacent the contact terminal, and thus the reliability of obtaining a detected signal is enhanced.

In accordance with a further embodiment of the present invention, the fixed contact pattern has a first pair of patterns and a second pair of patterns. The patterns of each of the pairs are separated apart at a predetermined distance from each other. The movable contact has a first movable contact and a second movable contact corresponding to the first pair and the second pair, respectively. In a preferred embodiment, as the movable contact is depressed, one of the first and second movable contacts initially contacts one of the associated first and second fixed contacts. The other of the first and second movable contacts then contacts both of the first pair and the second pair by further depressing the movable contact.

In one embodiment, a first movable contact contacts the associated fixed contact patterns to conductively connect the fixed contact patterns by depressing the switch, and a second movable contact then contacts the associated fixed contact patterns together with the fixed contact patterns associated with the first movable contact to conductively connect both of the patterns. As a result, even if the first movable contact separates from the associated fixed patterns due to chatter, the second movable contact performs as a backup and also conductively connects the fixed contact patterns associated with the first movable contact. As a consequence, both of the fixed contact patterns securely contact the movable contacts. Accordingly, signal failures caused by chatter are substantially eliminated, and therefore highly reliable information about time differences can be detected.

In accordance with a still further embodiment of the present invention, the fixed contact patterns are formed in a radial pattern. In an embodiment of the present invention, a movable contact for the first contact is provided adjacent the center of the fixed contact, and a doughnut-shaped continuous movable pattern is provided about the first movable contact. By this structure, the pair of fixed contacts for the first contact and the second contact are conductively connected at the same by the simple structure of the doughnut-shaped movable contact.

In accordance with another embodiment of the present invention, the fixed contact patterns are formed in the shape of oppositely engaged comb teeth. As a result, all the patterns are composed of straight lines, highly accurate patterns are readily formed, and therefore the possibility of short circuits is reduced.

In accordance with another embodiment of the present invention, the common pattern of the fixed contact pattern is disposed at a location corresponding to each key of a keyboard apparatus, and a plurality of the common patterns are disposed successively in a key arrangement direction. In an embodiment of the present invention, the common patterns in the pairs of fixed contact patterns are successively formed at the respective associated keys in the key arrangement direction to provide a series of switch groups. In a further embodiment, when a series of two-make switches are disposed in the key arrangement direction, each switch is located within the width of a relatively narrow key. As a result, the size of a keyboard in the key arrangement direction, which is conventionally restricted by the diameter of the prior art switch structure, can be made smaller. Accordingly, the key pitch in a keyboard apparatus and thus the overall width of the keyboard apparatus are made smaller.

In accordance with an embodiment of the present invention, a switch apparatus has a fixed contact including a plurality of pairs of contact patterns formed on a printed substrate. The contact patterns in each pair are disposed opposite to each other. A movable contact is disposed above and opposing the fixed contact. The movable contact is adapted to contact the associated pair of fixed contact patterns to conductively connect the corresponding pairs of fixed contact patterns when the switch is depressed. In a preferred embodiment of the present invention, the movable contact includes a plurality of patterns that are formed to have a predetermined orientation. One pattern in each of the pairs of contact patterns defines a common pattern. A plurality of the common patterns are disposed successively in the predetermined orientation of the movable contact patterns. Therefore, the common patterns at the fixed contact side and the movable contacts are arranged in the same direction, and the switch becomes compact. When the switch is applied to a keyboard apparatus, the common patterns are successively formed along the longitudinal direction of a key, and thus the substrate on which the switch is mounted has a narrower width. When the common patterns are also successively formed in the key arrangement direction, the key arrangement pitch becomes smaller.

Other features and advantages of the invention will be apparent from the following detailed description, taken in conjunction with the accompanying drawings which illustrate, by way of example, various features of embodiments of the invention.

BRIEF DESCRIPTION OF THE DRAWINGS

Preferred embodiments of the present invention will be described in connection with the drawing wherein:

FIG. 1 (A) shows a plan view of a fixed contact pattern in a switch apparatus in accordance with an embodiment of the present invention.

FIG. 1 (B) shows a plan view of the fixed contact pattern shown in FIG. 1 (A) and an associated movable contact pattern in a switch apparatus in accordance with an embodiment of the present invention.

FIG. 2 shows a circuit diagram using the switch apparatus shown in FIG. 1.

FIG. 5 (B) shows a plan view of a fixed contact pattern and an associated movable contact pattern in a switch apparatus in accordance with an embodiment of the present invention.

FIG. 6 (B) shows a cross-section of the movable contact device taken along line B—B shown in FIG. 6 (A).

FIG. 6 (C) shows a plan view of a fixed contact pattern that may be used in combination with the movable contact device shown in FIGS. 6 (A) and (B).

FIG. 8 (B) shows a cross-section of the movable contact device taken along line B—B shown in FIG. 8 (A).

FIG. 8 (C) shows a plan view of a fixed contact pattern that may be used in combination with the movable contact device shown in FIGS. 8 (A) and (B).

FIG. 8 (D) show a plan view of a fixed contact pattern that may be used in combination with the movable contact device shown in FIGS. 8 (A) and (B).

FIG. 9 (B) shows a cross-section of the movable contact device taken along line B—B shown in FIG. 9 (A).

FIG. 9 (C) shows a plan view of a fixed contact pattern that may be used in combination with the movable contact device shown in FIGS. 9 (A) and (B).

FIG. 10 (B) shows a switch apparatus in accordance with an embodiment of the present invention.

FIGS. 11 (A) and (B) show a fixed contact pattern and a movable contact pattern of a prior art switch apparatus.

FIG. 12 shows a circuit diagram of a prior art switch apparatus.

FIG. 13 (A) shows a cross-section of a movable contact device in a prior art two-make switch.

FIG. 13 (B) shows a cross-section of a movable contact device in a prior art two-make switch.

DETAILED DESCRIPTION OF EMBODIMENTS

Figure 3:
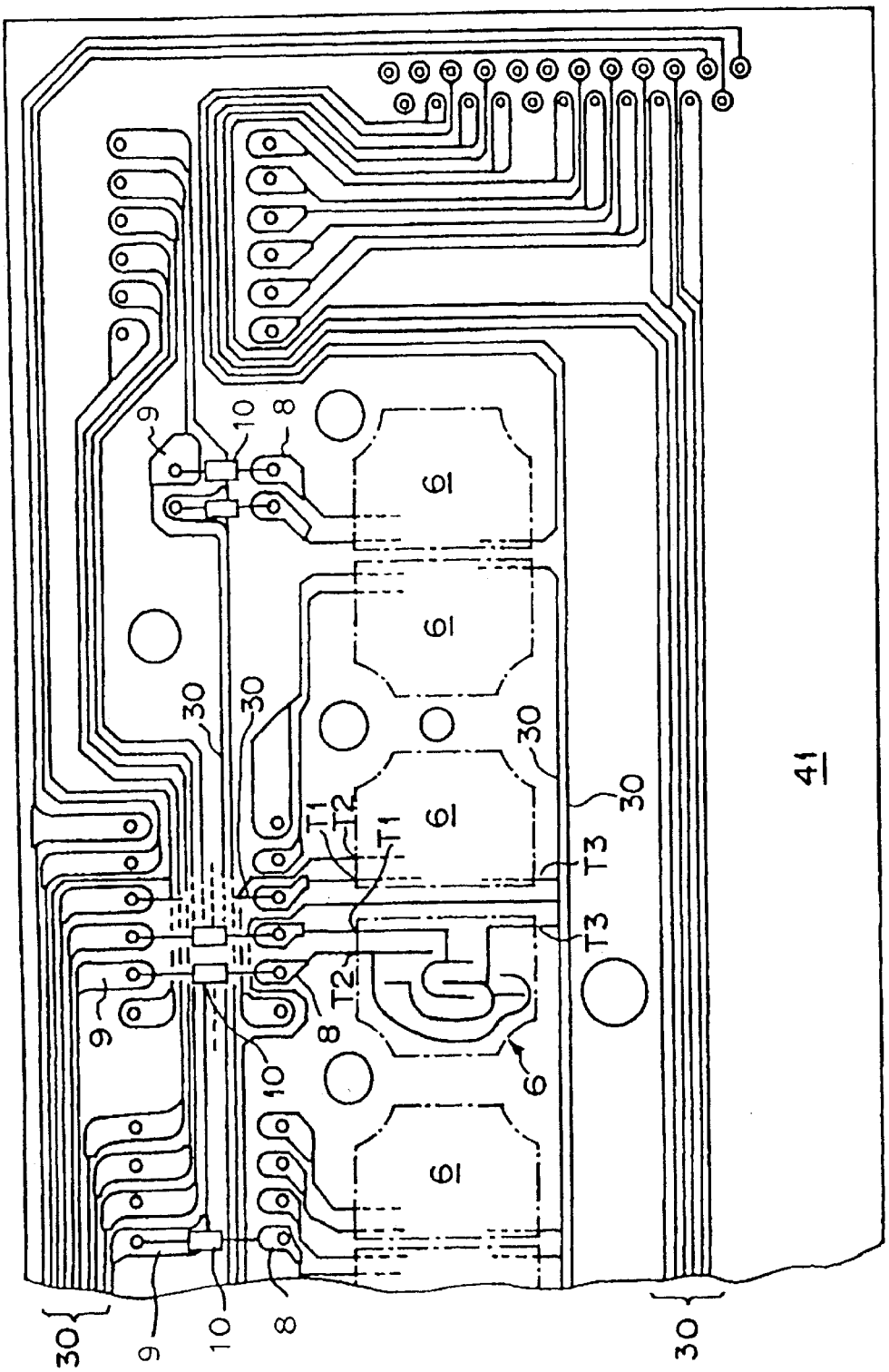
FIG. 3 shows a plan view of a printed substrate of an electronic keyboard apparatus for mounting switch apparatuses shown FIGS. 1 (A) and 1 (B).

It is noted that similar elements will be represented by similar reference numbers throughout the description of preferred embodiments.

FIG. 1 (A) shows a fixed contact pattern 6 that is formed on a printed substrate 41, and FIG. 1 (B) shows a movable contact pattern 26a and 26b that engage the fixed contact pattern 6. The fixed contact pattern 6 and the movable contact patterns 26a and 26b define a two-make switch 7. In accordance with an embodiment of the present invention, the fixed contact pattern 6 includes an internal pair 4 and an external pair 5. The internal pair 4 is defined by an internal pattern 1 and a common pattern 3, and an external pair 5 is defined by an external pattern 2 and the common pattern 3. The fixed contact 6 is therefore defined by the internal pair 4 and the external pair 5 that shares the common pattern 3. The internal pattern 1, the external pattern 2 and the common pattern 3 have a first contact terminal T1, a second contact terminal T2 and a third contact terminal T3, respectively, that are connected to an external wiring pattern 30. The internal pattern 1, the external pattern 2 and the common pattern 3 have relatively complicated shapes that are interlaced with one another within the interior of the switch apparatus. The contact terminals T1, T2 and T3 define base sections 1a, 2a and 3a of the internal pattern 1, the external pattern 2 and the common pattern 3, respectively, and are separated by a predetermined distance from one another. In one embodiment, the base section 3a of the common pattern 3 is thicker than a leading section 3b of the common pattern 3.

A movable contact is provided above the fixed contact 6. The movable contact is formed from a first circular movable contact 25 at its center and arc-shaped second movable contacts 26a and 26b about the first movable contact 25. The first movable contact 25 contacts the internal pattern 1 and the common pattern 3, which define the internal pair 4, to conductively connect the internal pattern 1 and the common pattern 3 together. Thereafter, the second movable contacts 26a and 26b come in contact with the external pattern 2 and the common pattern 3, which define the external pair 5, to conductively connect the external pattern 2 and the common pattern 3.

For example, the two-make switch of this type is provided for each of the keys of an electronic keyboard apparatus to generate a key-on signal and a key depression speed signal in association with the movement of the key. FIG. 2 shows a circuit diagram of a two-make switch in accordance with one embodiment of the present invention. A contact section (including a two-make switch) 7 is formed from the fixed contact and the movable contact described above with reference to FIGS. 1 (A) and (B). The three contact terminals T1, T2 and T3 of the fixed contact 6 are connected through, for example, diodes, to three wiring patterns 30 formed on a printed substrate external to the switch. Each of the wiring patters 30 is connected to a CPU (not shown) for generating an electronic sound or controlling timbre, loudness and a variety of other musical sounds in association with the key manipulations.

In the illustrated embodiment, the movable contact device of the two-make switch is mounted on the printed substrate in a similar manner as described above with reference to FIGS. 13 (A) and (B). Also, the movable contact device has a structure that is similar to those described above with reference to FIGS. 13 (A) and (B). Therefore the detailed description therefor is omitted.

Figure 4:
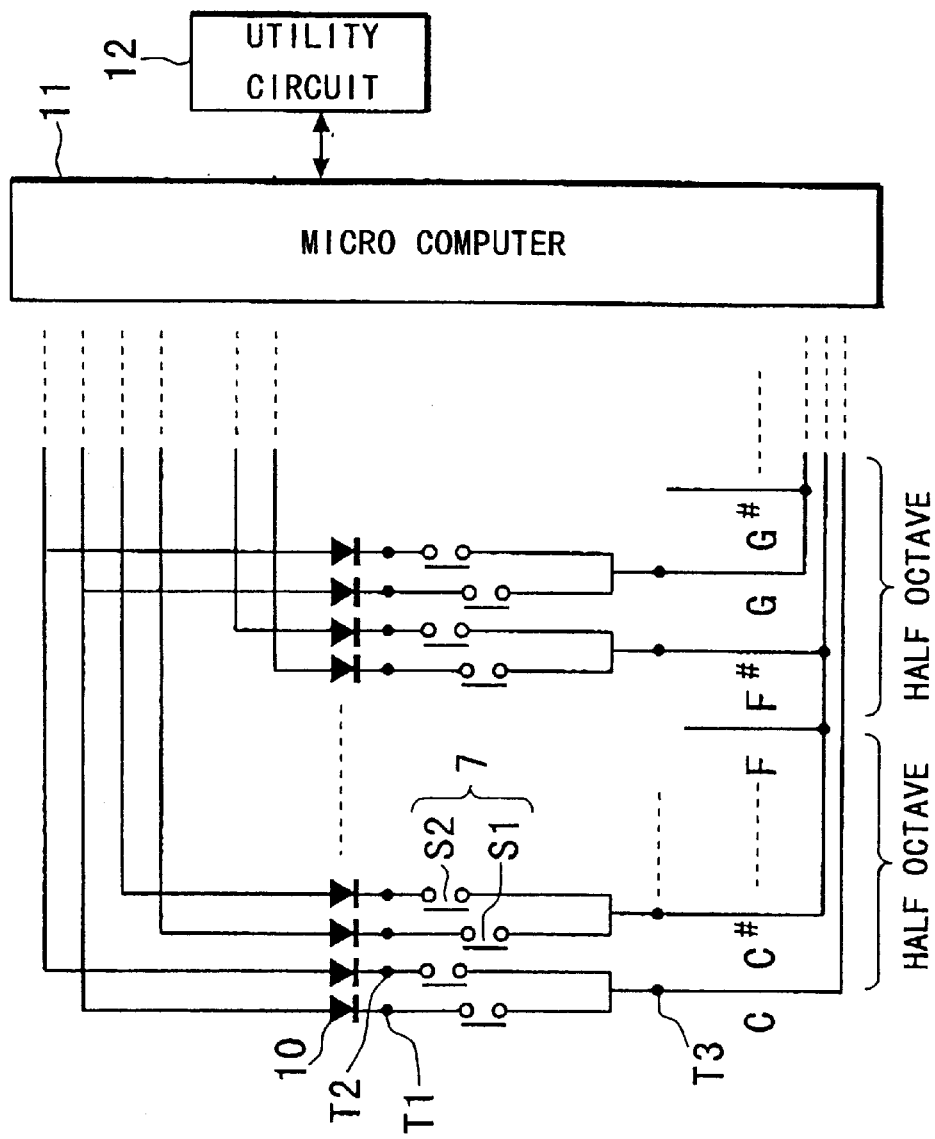
FIG. 4 shows a circuit diagram for the printed circuit board shown in FIG. 3.

FIG. 3 shows a plan view in part of the printed substrate 41 that is provided under the keyboard of an electronic keyboard apparatus. The fixed contact 6 having the three contact terminals T1, T2 and T3 is formed at a location corresponding to each key (not shown). Movable contacts (similar to the movable contacts 25 and 26a and 26 shown in FIGS. 13 (A) and (B)) are provided at locations corresponding to each of the fixed contacts 6. The contact terminals T1, T2 and T3 of each of the fixed contacts 6 are connected to the external wiring pattern 30, and also connected to check diodes 10 through land patterns 8 and 9. As shown in FIG. 4, the check diode is provided for each contact to prevent leakage of electric current to one contact of the two-make switch that is not closed when the other contact is closed.

FIG. 4 shows a control circuit diagram for part of an electronic keyboard apparatus in which two-make switches in accordance with an embodiment of the present invention are mounted. The reference numeral S1 denotes a first contact that is defined by the first movable contact 25 and the internal pair 4 (see FIG. 1). The reference numeral S2 denotes a second contact that is defined by the second movable contacts 26a and 26b and the external pair 5. Each of the two-make switches, each having the first contact S1 and the second contact S2, is provided for each key. The switches are grouped into, for example, a block for a half octave consisting of C, C#, D. . . F and a block for the other half octave consisting of F#, G, G#. . . B. Each block is connected to a microcomputer (CPU) 11. The blocks may be subjected to time division key scanning to control various musical sounds. The microcomputer 11 is connected to a utility circuit 12. The utility circuit 12 is a musical sound generating apparatus that includes circuits for generating physical sounds, circuits for forming various musical sounds, amplifiers, loud speakers, and the like. The detailed description of the control of the utility circuit by the computer is omitted since it is common to the art.

Figure 5:
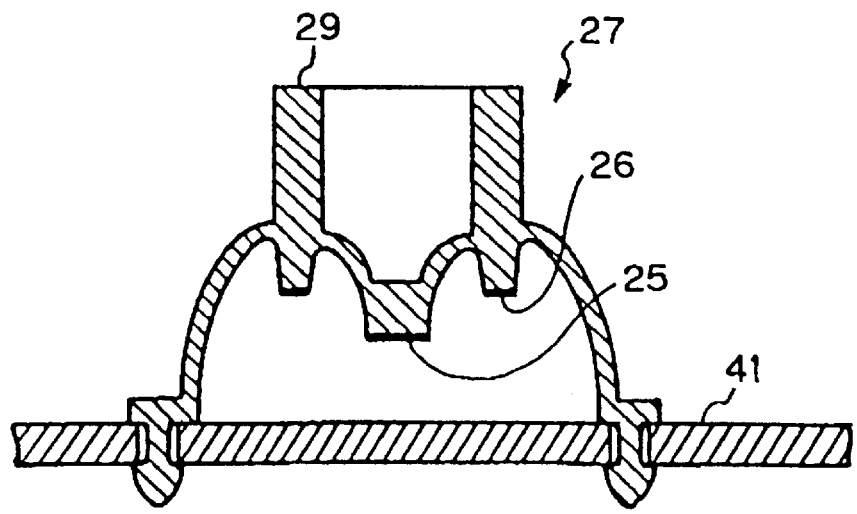
FIG. 5 (A) shows a cross-section of a movable contact of a switch apparatus in accordance with an embodiment of the present invention.
Figure 5:
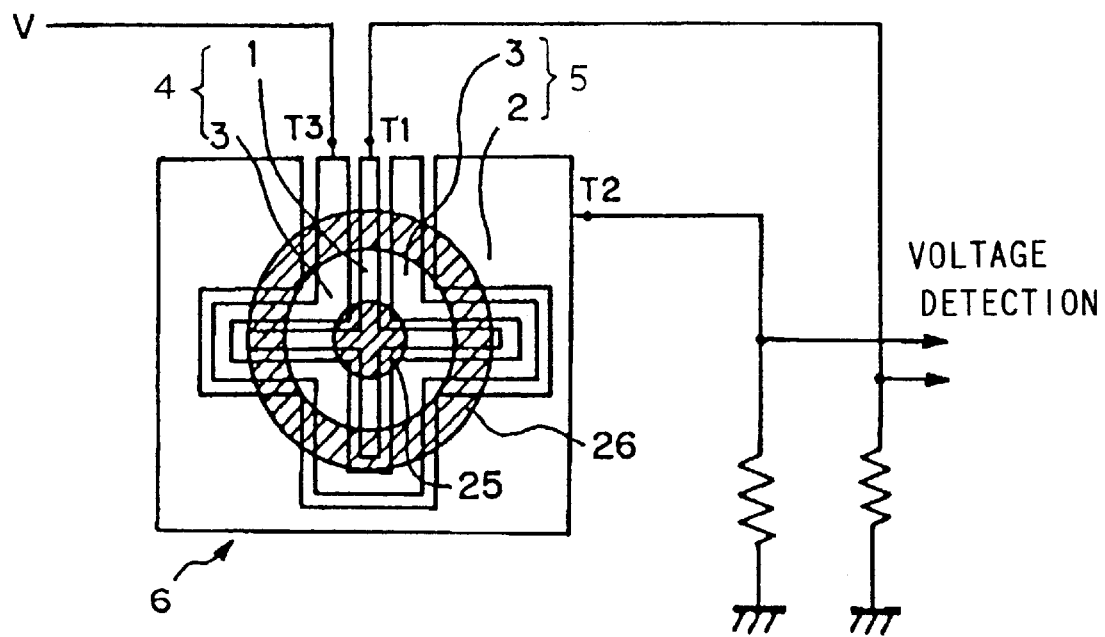

FIG. 5 (A) shows a cross-section of a movable contact device which has movable contacts 25 and 26. FIG. 5 (B) shows a plan view of a fixed contact pattern 6 and the associated movable contact patterns 25 and 26 in accordance with another embodiment of the present invention. The movable contact device and the movable contact patterns 25 and 26 define a two-make switch apparatus 27. In this embodiment, the movable contact device includes a circular central contact 25 and a continuous doughnut-shaped second movable contact 26 about the circular central contact 25. The fixed contact 6 is formed from cross-shaped patterns that are radially extending, as shown in FIG. 5 (B). The fixed contact 6 has an internal pattern 1 at the center, an external pattern 2 located external to the internal pattern and a common pattern 3 located between the internal pattern 1 and the external pattern 2. The internal pattern 1 has two intersecting segment patterns that radially extend across the center of the internal pattern 1, which form a cross-shaped pattern, as shown in FIG. 5 (B). These patterns are separated by a predetermined distance from one another. The internal pattern 1 and the common pattern 3 define an internal pair 4, and the external pattern 2 and the common pattern 3 define an external pair 5. The patterns 1, 2 and 3 have contact terminals T1, T2, and T3, respectively, that are connected to an external wiring pattern. The internal pattern 1 and the external pattern 2 are grounded through resistors, and the common pattern 3 is connected to a power source voltage V. The internal pattern 1 and the external pattern 2 are connected to a voltage detecting circuit (not shown), and used, for example, for controlling a variety of musical sounds.

The movable contact device has a depression section 29 that is depressed by a driving section of a key of a keyboard apparatus. When the depression section 29 is depressed, the central circular movable contact 25 first contacts the internal pair 4 to conductively connect the contact terminals T1 and T3. By further depressing the depression section 29, the doughnut-shaped second movable contact 26 contacts the internal pattern 1, the external pattern 2 and the common pattern 3. As a result, the contact terminals T1 and T2 of the external pair 5 are closed, and the contact terminals T1 and T3, that are closed by the first movable contact, are further conductively connected by the second movable contact 26. Thus, even if the first movable contact 25 for the first contact is separated from the patterns 1 and 3 of the internal pair 4 due to chatter, the second movable contact 26 for the second contact contacts both of the external pair 5 and the internal pair 4 to substantially eliminate chatter. Accordingly, when the second movable contact 26 contacts the internal pattern 1, the external pattern 2 and the common pattern 3, the internal pair 4 is maintained in a closed state.

In accordance with the structure of the two-make switch shown in FIGS. 5 (A) and (B), the occurrence of chatter is prevented. Furthermore, the structure is simplified by the use of the radially extending patterns and the common pattern, and thus the pattern area is reduced, and the switch apparatus is substantially miniaturized.

The patterns are not limited to the cross-shaped patterns in which the patterns are radially extending in four directions. For example, other embodiment patterns include patterns radially extending in three directions in a Y-shape, and patterns radially extending in five or more directions. Furthermore, patterns radially extending in two directions, namely linear patterns are also used. Also, the shape of the second movable contact is not limited to the doughnut shape. Other shapes, including a circular shape and a linear shape, may be used as long as the selected shape comes in contact with the three patterns 1, 2 and 3.

Figure 6:
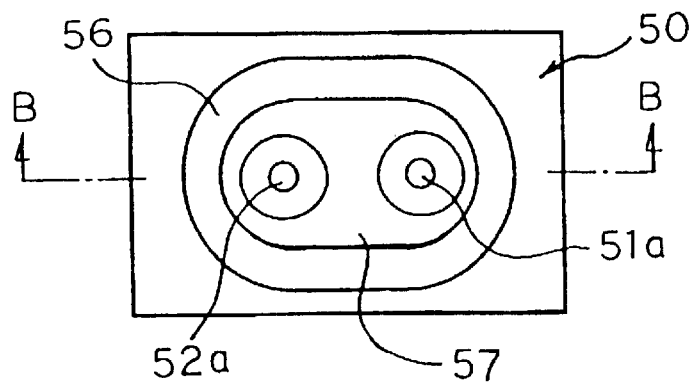
FIG. 6 (A) shows a plan view of a movable contact device of a switch device in accordance with still another embodiment of the present invention.
Figure 6:
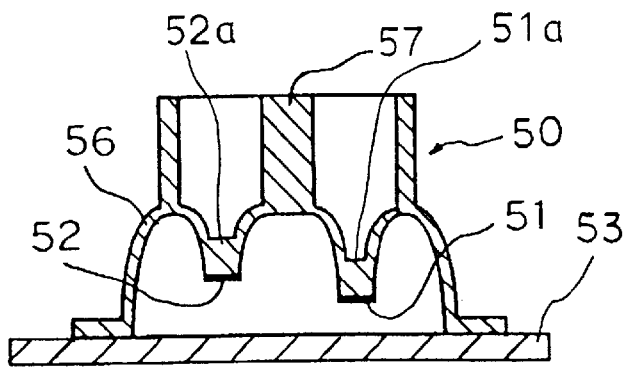
Figure 6:
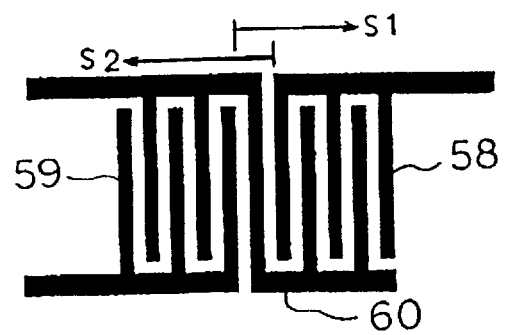

FIG. 6 (A) shows a plan view of a movable contact device of a two-make switch apparatus 50 in accordance with another embodiment of the present invention. FIG. 6 (B) shows a cross-section of the movable contact device as taken along a line B—B shown in FIG. 6 (A). FIG. 6 (C) shows a fixed contact having fixed contact patterns 58, 59 and 60. The two-make switch 50 in the illustrated embodiment has a first movable contact 51 and a second movable contact 52 disposed adjacent each other in a step-wise fashion in the height direction. The first movable contact 51 and the second movable contact 52 are provided above a printed substrate 53. The reference numerals 51a and 52a denote rear (upper) sides of the movable contacts 51 and 52, respectively. The reference numeral 56 denotes an elastic deforming section, and the reference numeral 57 denotes a top surface that comes in contact with a driving section of a key of a keyboard apparatus.

Figure 14:
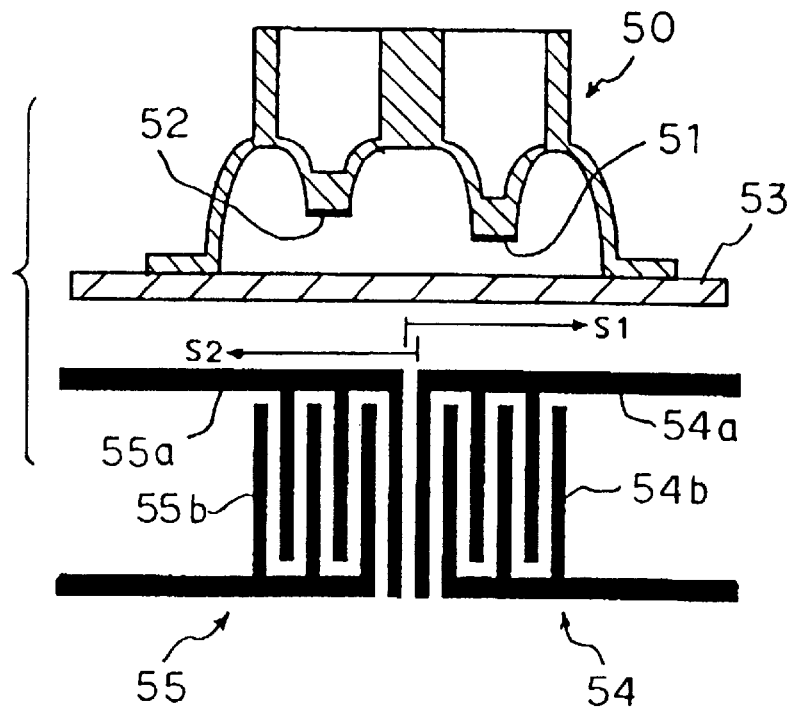
FIG. 14 shows a fixed contact and a movable contact of a prior art switch apparatus.

As shown in FIG. 6 (C), a fixed contact is composed of a first fixed contact pattern 58, a second fixed contact pattern 59 and a common pattern 60. The fixed contact is formed on the printed substrate 53. The fixed contact is an improvement over the conventional fixed contacts 54 and 55 described above with reference to FIG. 14. The first and the second fixed contact patterns 58 and 59 are formed in the shape of comb-teeth. The comb-teeth fixed contact patterns 58 and 59 are disposed with their respective comb-teeth ends opposing to each other in the direction of the comb teeth. The common pattern 60, which is also in the form of comb-teeth, is disposed with its comb-teeth pattern being engaged with the comb-teeth patterns of the patterns 58 and 59. In the illustrated embodiment, the linear comb-teeth patterns of the common pattern 60 are interleaved with the linear comb-teeth patterns of the fixed contact patterns 58 and 59. In other words, two rows of the linear comb-teeth patterns include the fixed contact patterns 58 and 59 and the common pattern 60, as shown in FIG. 6 (C). As a result, the first fixed contact pattern 58 and the second fixed contact pattern 59, that are disposed opposing to each other, individually provide switch function within ranges indicated by S1 and S2, respectively. In other words, as shown in FIG. 6 (C), the movable contact 51 can be shifted over a pair of the first fixed contact pattern 58 and the common pattern 60 within the range S1 for a normal switch function. On the other hand, the movable contact 52 can be shifted for a normal switch function over a pair of the second fixed contact pattern 59 and the common pattern 60 within the range S2 without interfering the switching function of the pair of the first fixed contact pattern 58 and the common pattern 60. An allowable movable contact positioning range between the range S1 and the range S2, in which each pair of the movable contact and the fixed contact pattern is functional as a switch without interfering the adjacent pair, is expanded about three times as compared with the prior art shown in FIG. 14. Accordingly, the reliability of the switch function is improved, a smaller switch can be made by a comb-teeth pattern with the same printing precision of the prior art. Other effects are substantially the same as those of the embodiment described above with reference to FIGS. 5 (A) and (B).

Figure 7:
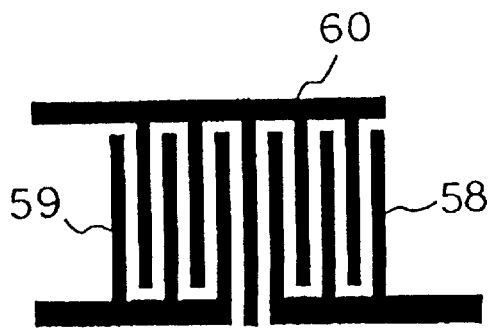
FIG. 7 shows a fixed contact pattern in accordance with a further embodiment of the present invention.

FIG. 7 shows a fixed contact in accordance with another embodiment of the present invention. In FIG. 6 (C), the first fixed contact pattern 58 and the second fixed contact pattern 59 are disposed in a manner that the comb-teeth patterns are opposed to each other. In accordance with the embodiment shown in FIG. 7, the patterns 58 and 59 are disposed in a manner that the comb-teeth patterns are oriented in the same direction (the upward direction in the figure). A common pattern 60 is disposed with its comb-teeth pattern being directed downwardly to interlace with the patterns 58 and 59.

Figure 8:
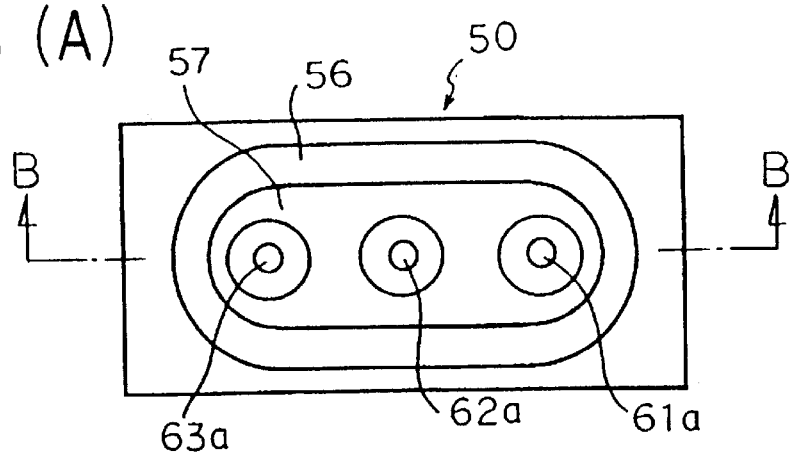
FIG. 8 (A) shows a plan view of a movable contact device of a switch device in accordance with another embodiment of the present invention.
Figure 8:
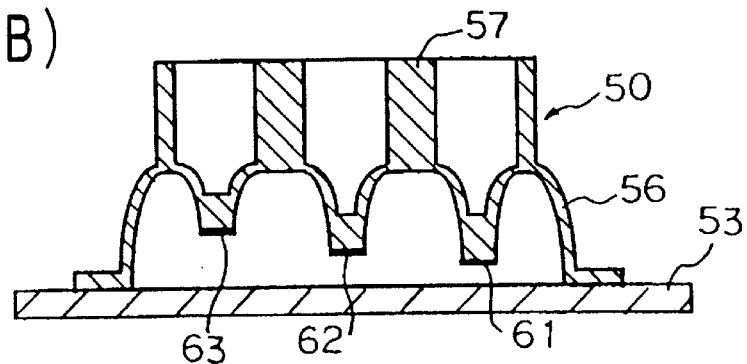
Figure 8:
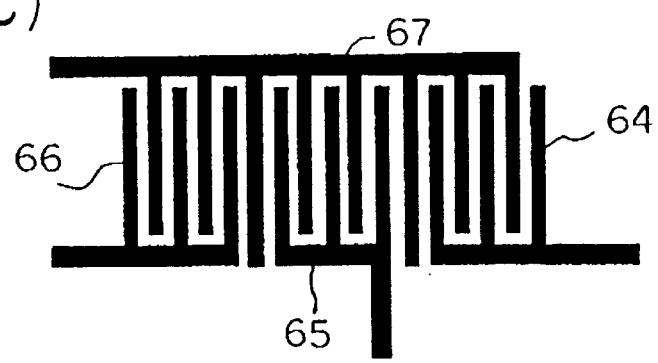
Figure 8:
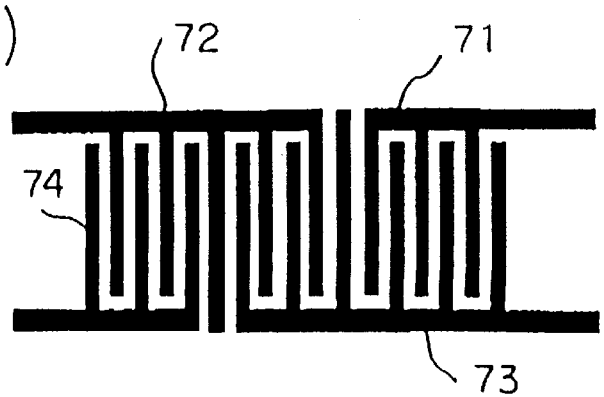

FIGS. 8 (A)–(D) show a switch structure in accordance with a further embodiment of the present invention that relates to a three-make switch 50. First, second and third movable contacts 61, 62 and 63 having different heights are disposed over a printed substrate 53. Comb-teeth shaped first, second and third fixed contact patterns 64, 65 and 66 are successively disposed on the printed substrate 53 at locations corresponding to the first, second and third movable contacts 61, 62 and 63, respectively, in a direction perpendicular to the comb-teeth patterns of the fixed contacts, as shown in FIG. 8 (C). Each of the fixed contact patterns 64, 65 and 66 is disposed with the respective comb-teeth pattern being oriented in an upward direction in the figure. A common pattern 67 is formed with its comb-teeth pattern being interlaced with each of the comb-teeth fixed contact patterns 64, 65 and 66. The fixed contact patterns 64, 65 and 66 respectively pair with the common contact to define three pairs of fixed contacts. As the top surface 57 of the switch device 50 is depressed, the first movable contact 61, the second movable contact 62 and the third movable contact 63 successively come in contact with the corresponding pairs of fixed contacts to cause the switch to make contacts in three stages. Other structures and effects are substantially the same as those of the above embodiment described with reference to FIGS. 5 (A) and (B).

FIG. 8 (D) shows a fixed contact pattern for a three-make switch in accordance with another embodiment of the present invention. In this embodiment, the fixed contact pattern includes four patterns, namely, first, second, third and fourth patterns 71, 72, 73 and 74, in the shape of comb-teeth. The first pattern 71 and the second pattern 72 are disposed with their comb-teeth being downwardly oriented, and the third pattern 73 is disposed as a common pattern with its upwardly oriented teeth being interlaced with the teeth of the first and second patterns 71 and 72. Also, the second pattern 72 is disposed as a common pattern with its downwardly oriented teeth being interlaced with the upwardly oriented teeth of the third pattern 73 and the fourth pattern 74. When the top surface 57 of the switch device 50 is depressed, the first, the second and the third movable contacts 61, 62 and 63 successively come in contact with the corresponding pairs of the fixed contacts to cause the switch to make contacts in three stages. Other structures and effects are substantially the same as those of the embodiment described above with reference to FIGS. 5 (A) and (B).

Figure 9:
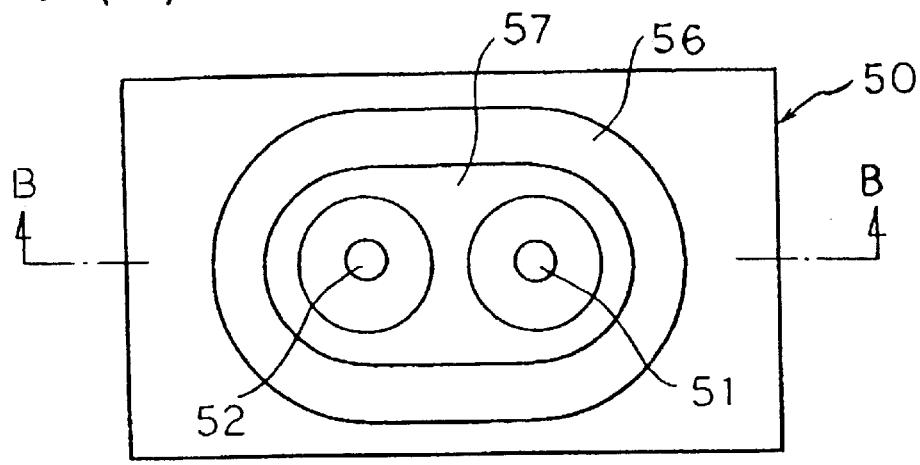
FIG. 9 (A) shows a plan view of a movable contact device of a switch device in accordance with another embodiment of the present invention.
Figure 9:
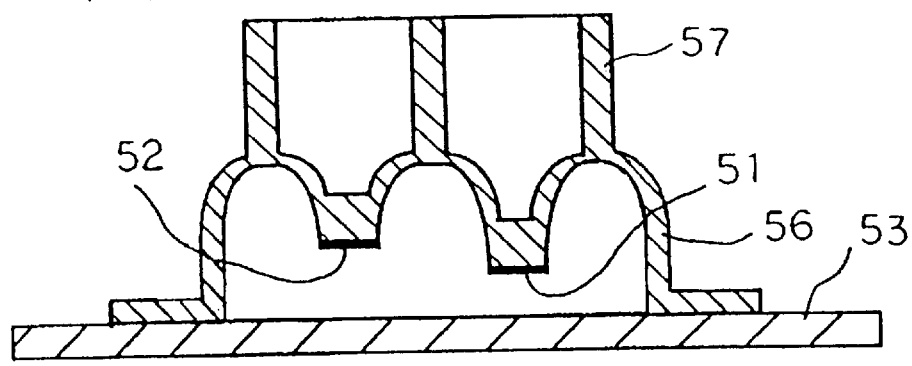
Figure 9:
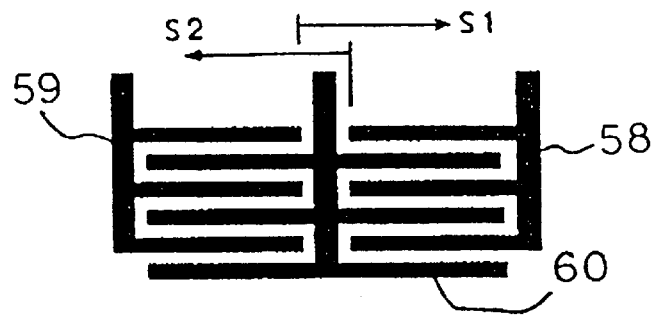
Figure 15:
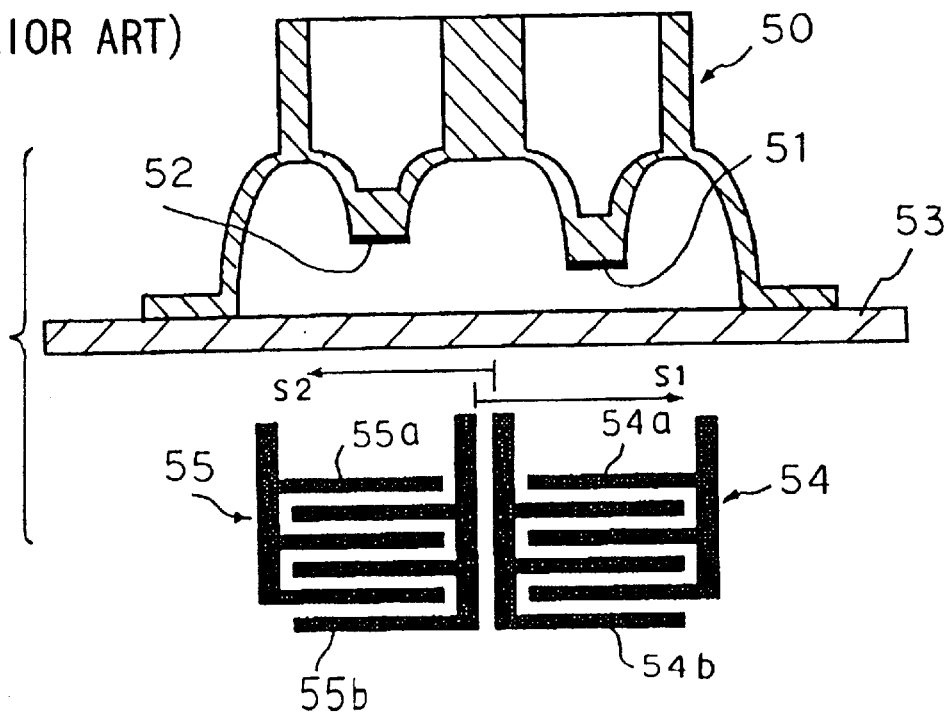
FIG. 15 shows a fixed contact and a movable contact of a prior art switch apparatus.

FIGS. 9 (A)–(C) show a further embodiment of the present invention. This embodiment provides an improvement over the conventional structure described above with reference to FIG. 15. Namely, a first fixed contact pattern 58 and a second fixed contact pattern 59 in the shape of comb-teeth are disposed with their teeth being opposed to each other, and a common pattern 60 having teeth extending from its center in opposite directions is disposed with its teeth being interlaced with the first and second fixed contact patterns 58 and 59. Each of the first and the second fixed contact patterns 58 and 59 pairs with the common pattern 60 to define a pair of fixed contacts.

Since the common pattern 60 is disposed between the fixed contact patterns 58 and 59 that are formed from the straight comb-teeth patterns, the first fixed contact pattern 58 and the second fixed contact pattern 59, that are disposed in parallel with each other, are individually functional as normal switches within ranges defined by S1 and S2, respectively. As a result, as shown in the figure, the allowable switch occupancy range, in which each of the switches is functional, is expanded about three times as compared with the prior art shown in FIG. 15. In other words, a smaller switch can be made by a comb-teeth pattern with the same printing precision of the prior art.

Figure 10:
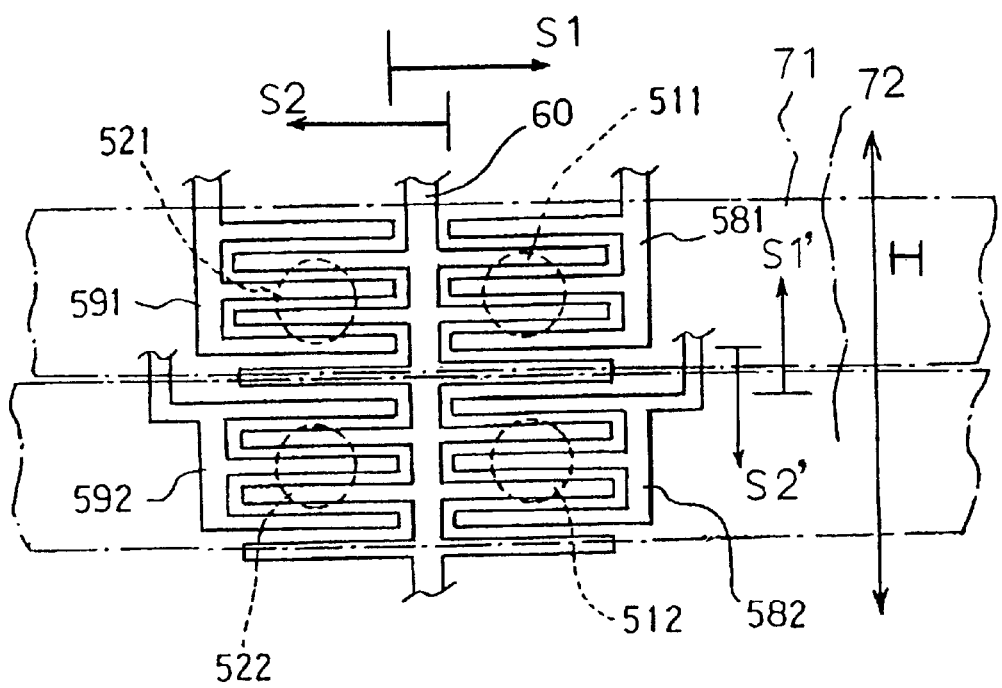
FIG. 10 (A) shows a plurality of switch apparatuses arranged for a keyboard apparatus in accordance with an embodiment of the present invention.
Figure 10:
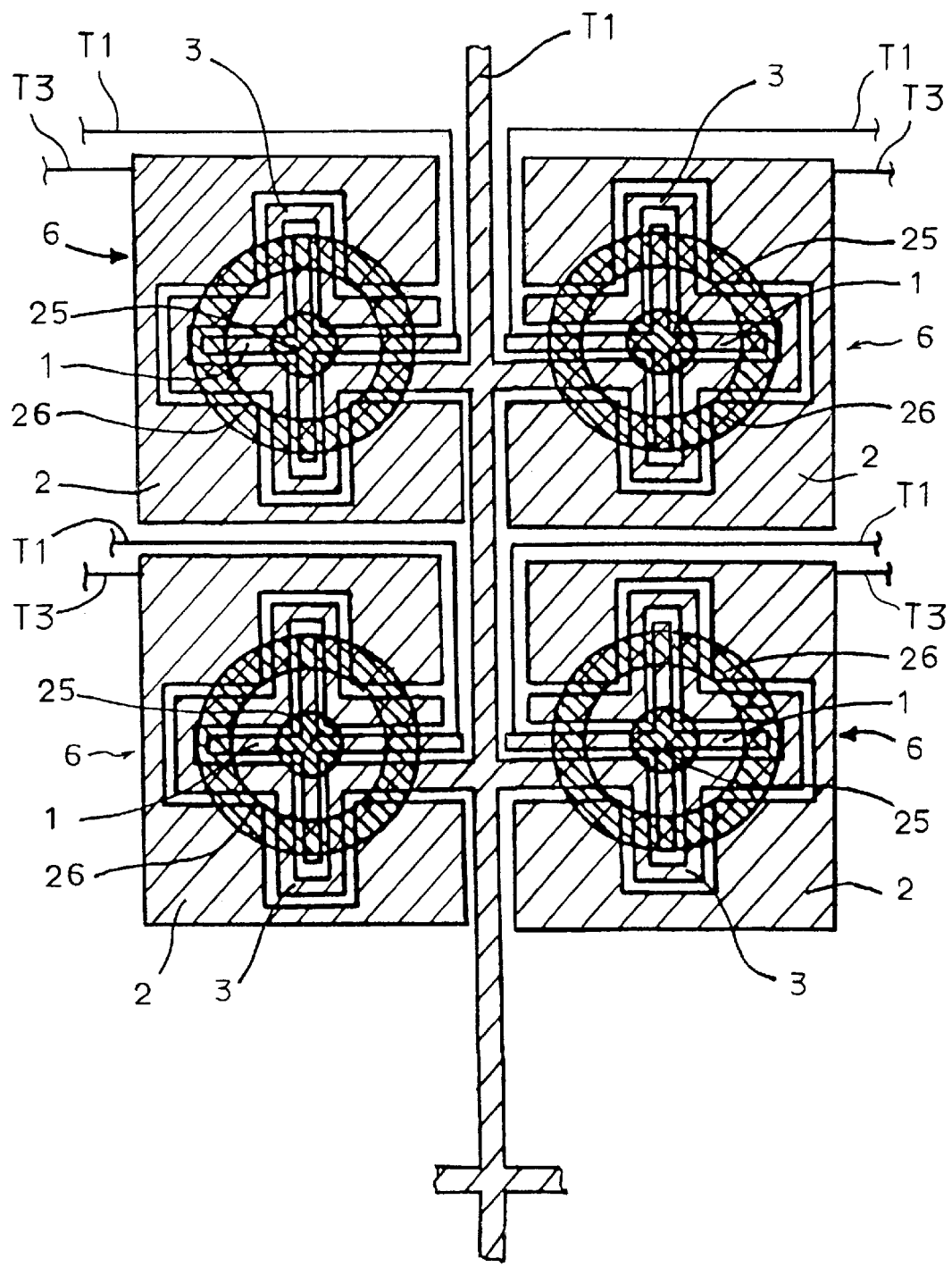

FIGS. 10 (A) and 10 (B) show switch apparatuses mounted on a keyboard apparatus in accordance with further embodiments of the present invention. In the embodiment shown in FIG. 10 (A), a plurality of the switches shown in FIG. 9 are successively disposed in the key arrangement direction as shown by an arrow H in FIG. 10 (A). A first fixed contact pattern 581 and a second fixed contact pattern 591 both in the shape of comb-teeth are disposed opposite to each other in the direction of the length of a key 71, which is generally perpendicular to the key arrangement direction H. In a similar manner, a first fixed contact pattern 582 and a second fixed contact pattern 592 both in the shape of comb-teeth are disposed opposite to each other in the direction of the length of an adjacent key 72. A common pattern 60 is formed between the first fixed contact patterns 581 and 582 and the second fixed contact patterns 591 and 592, in a manner similar to the embodiment shown in FIG. 9. Movable contacts 511 and 521 are provided over the fixed contact patterns 581 and 591, respectively, and movable contacts 512 and 522 are provided over the fixed contact patterns 582 and 592, respectively. The common patterns 60 for the keys 71 and 72 are continuously formed in a direction shown by an arrow H in which the keys including the keys 71 and 72 are arranged. Therefore, the common patterns for the fixed contacts are formed in the direction of the length of the key and also continuously formed in the key arrangement direction. The corresponding associated movable contacts are also arranged in the direction of the length of the key and continuously formed in the key arrangement direction. By this structure, the first fixed contact pattern and the second fixed contact pattern individually provide switching function in the direction of the length of a key within ranges indicated by S1 and S2, respectively. Thus, the allowable fixed contact positioning range is expanded about three times as compared with the prior art shown in FIG. 15. Also, the switches are individually functional in the key arrangement direction (the direction H) within ranges indicated by S1' and S2'. As a result, the range in which each of the switches is functional is expanded in both of the direction of the length of the key and the key arrangement direction, and a smaller sized switch is obtained due to the use of the common pattern. For example, where a plurality of switch devices are provided as ordinary switches for the corresponding keys, only a right column of the switch devices or a left column of the switch devices may be used. In this case, the substrate that mounts the switches thereon has a reduced width in the key arrangement direction, and the substrate has a reduced width in the direction of the length of the key. In both cases, the key pitch in the key arrangement direction is reduced and therefore a narrower key can be used. As a result, the overall size of a keyboard apparatus can be reduced.

FIG. 10 (B) shows a further embodiment in which a plurality of the switch structures shown in FIGS. 5 (A) and 5 (B) are successively disposed in the key arrangement direction. A set of two fixed contact patterns 6 is formed in the direction of the length of the key for each key, and a plurality of sets of two fixed contact patterns 6 are disposed in the key arrangement direction. Elements in FIG. 10 (B) that are similar to those shown in FIG. 5 (B) are represented by the same reference numerals as shown in FIG. 5 (B), and therefore the detailed description thereof is omitted. By this structure, the common pattern T1 in the fixed contact is formed in the direction of the length of the key and continuously formed in the key arrangement direction. The corresponding associated movable contacts are successively disposed along the direction of the length of the key and in the key arrangement direction. As a result, effects similar to those obtained in the embodiment shown with reference to FIG. 10 (A) are obtained.

As described above, in accordance with an embodiment of the present invention, each of a first fixed contact and a second fixed contact is composed of a pair of patterns. One of the patterns of the first fixed contact pair and one of the patterns of the second fixed contact pair are formed in a unit to define a common pattern. The common pattern is disposed between the other patterns of the first and the second fixed contact pairs. As a result, the fixed contact is formed by a smaller number of patterns. For a switch in accordance with embodiments of the present invention having the same size of a prior art switch, spare allowable space is provided for the switch operation. Thus, even if the movable contact deviates slightly from a specified location with respect to the fixed contact, the switching operation is not affected. Accordingly, production yield improves. Also, since some of the fixed contact patterns in a fixed contact are formed in a unit to define a common pattern, the space for mounting a fixed contact is reduced and therefore a smaller sized switch is provided. Furthermore, with the same production yield in manufacturing switches, a switch can be manufactured in smaller size as compared with that of the conventional switch. For example, in a two-make switch having two pairs of fixed contact patterns, one of the fixed contact patterns in each of the pairs is formed as a common pattern. As a result, the structure of the fixed contact patterns is simplified and the manufacturing process is facilitated. Therefore, the size of a switch apparatus is reduced. Furthermore, the reliability of signal detection is improved because the electrical resistance value of the pattern is reduced. Also, in a switch apparatus having a first movable contact for contact with a first pair of fixed contacts and a second movable contact for contact with a second pair of fixed contacts, if the second movable contact is made in a manner in which the second movable contact contacts both pairs of fixed contacts at the same time, the occurrence of chatter is prevented. As a consequence, secure two-make switching is achieved and highly reliable information detection is obtained.

Each of the embodiments described above relates to a touch response switch in a keyboard apparatus having a fixed contact pattern. However, the present invention is not limited to these embodiments. The present invention is applicable to a switch having two or more contact circuits. The present invention is also applicable to a switch apparatus having a plurality of individually functional switch contacts. For example, the present invention is applicable to a switch having plural pairs of contacts in which after the switch is turned on by closing one of the contact pairs by depressing the switch, the switch is turned off later by further depressing the switch. Also the present invention is applicable to a multiple-switch having a plurality of independent switches in which the independent switches are simultaneously turned on and off.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A switch apparatus comprising:
    a printed substrate;
    a fixed contact generally defining a center and including a first pair of first and second fixed contact patterns and a second pair of first and second fixed contact patterns formed on the printed substrate, the fixed contact patterns of the first pair and the second pair being separated from one another by a predetermined distance, wherein the first fixed contact pattern of the first pair of fixed contact patterns and the first fixed contact pattern of the second pair of fixed contact patterns are the same and define a common pattern, the common pattern being disposed between the second fixed contact pattern of the first pair and the second fixed contact pattern of the second pair,
    the second fixed contact pattern of the first pair having at least a first segment pattern radially extending across the center in a first direction and a second segment pattern radially extending across the center in a second direction transverse to the first direction; and
    a movable contact that comes in contact with the fixed contact to perform a switching operation, the movable contact having a first movable contact and a second movable contact for engagement with the first pair of fixed contact patterns and the second pair of fixed contact patterns, respectively.

2. A switch apparatus in accordance with claim 1, wherein the fixed contact patterns are formed by radially extending patterns.

3. A switch apparatus in accordance with claim 1, wherein each of the first pair of fixed contact patterns and the second pair of fixed contact patterns are formed by a pair of comb-teeth shaped patterns oppositely interlaced with each other.

4. A switch apparatus in accordance with claim 1, further comprising an electronic keyboard apparatus having a plurality of keys, the plurality of keys defining a key arrangement direction, the common pattern being disposed at each of the keys, wherein a plurality of the common patterns are disposed successively in the key arrangement direction.

5. A switch apparatus in accordance with claim 1, further comprising an electronic keyboard apparatus having a plurality of keys, the plurality of keys defining a key arrangement direction, wherein a pair of the fixed contact and the movable contact is provided for each of the keys, a plurality of the common patterns of a plurality of the fixed contacts for the associated keys being successively formed in the key arrangement direction, the common pattern of each of the fixed contacts being arranged in the direction of the length of each key.

6. A switch apparatus comprising:
    a printed substrate;
    a fixed contact defining a center and including at least a pair of first and second internal patterns and a pair of first and second external patterns; the internal patterns and the external patterns being formed on the printed substrate and separated from one another by a predetermined distance,
    the first internal pattern and the first external pattern defining a common pattern,
    the second internal pattern having at least a first segment pattern radially extending across the center in a first direction and a second segment pattern radially extending across the center in a second direction transverse to the first direction; and
    a movable contact that comes in contact with the fixed contact to perform a switching operation, the movable contact having a first movable contact and a second movable contact for contacting the pair of internal patterns and the pair of external patterns, respectively.

7. A switch apparatus in accordance with claim 6, wherein each of the internal patterns and the external patterns has a base section defining a contact terminal that is connected to a wiring pattern external to the switch apparatus and a leading section that connects to the base section, wherein the base section of the common pattern is wider than the leading section thereof.

8. A switch apparatus in accordance with claim 7, further comprising an electronic keyboard apparatus having a plurality of keys, the plurality of keys defining a key arrangement direction, wherein a pair of the fixed contact and the movable contact is provided on each of the keys, a plurality of the common patterns of a plurality of the fixed contacts for the associated keys being successively formed in the key arrangement direction, the common pattern of each of the fixed contacts being arranged in the direction of the length of each key.

9. A switch apparatus in accordance with claim 6, wherein the second internal pattern is disposed at the center and generally defines a cross shape.

10. A switch apparatus in accordance with claim 9, wherein the common pattern generally defines a cross shape.

11. A switch apparatus in accordance with claim 6, further comprising an electronic keyboard apparatus having a plurality of keys, the plurality of keys defining a key arrangement direction, and a generally straight elongated pattern extending in the key arrangement direction, wherein at least a pair of the common patterns connected to the generally straight elongated pattern and disposed across the generally straight elongated pattern and in the direction of the length of each key.

12. A switch apparatus in accordance with claim 6, further comprising an electronic keyboard apparatus having a plurality of keys, the plurality of keys defining a key arrangement direction, and a generally straight elongated pattern extending in the key arrangement direction, wherein a plurality of pairs of the common patterns connected to the generally straight elongated pattern and each of the plurality of pairs of the common patterns disposed across the generally straight elongated pattern and in the direction of the length of each key.

13. A switch apparatus comprising:
   a printed substrate;
   a fixed contact including a first pair of patterns and a second pair of patterns; the patterns of the first pair and the second pair being formed on the printed substrate and separated from one another by a predetermined distance; and
   a movable contact provided above and opposing the fixed contact, the movable contact for contacting the fixed contact to perform a switching operation, the movable contact having a first movable contact and a second movable contact for contacting the first pair of patterns and the second pair of patterns, respectively;
   wherein one of the first movable contact and the second movable contact initially comes into contact with one of the first pair of patterns and the second pair of patterns by depressing the movable contact, and the other of the first movable contact and the second movable contact then comes into contact with both of the first pair and the second pair by further depressing the movable contact.

14. A switch apparatus in accordance with claim 13, wherein one of the patterns in the first pair and one of the patterns in the second pair are the same and define a common pattern.

15. A switch apparatus in accordance with claim 14, further comprising an electronic keyboard apparatus having a plurality of keys, the plurality of keys defining a key arrangement direction, the common pattern being disposed at each of the keys, wherein a plurality of the common patterns are disposed successively in the key arrangement direction.

16. A switch apparatus in accordance with claim 14, further comprising an electronic keyboard apparatus having a plurality of keys, the plurality of keys defining a key arrangement direction, wherein a pair of the fixed contact and the movable contact is provided on each of the keys, a plurality of the common patterns of a plurality of the fixed contacts for the associated keys being successively formed in the key arrangement direction, the common pattern of each of the fixed contacts being arranged in the direction of the length of each key.

17. A switch apparatus comprising:
   a printed substrate;
   a fixed contact formed on the printed substrate, the fixed contact including two rows of opposing comb-shaped fixed contact patterns interlaced with one another, the two rows of fixed contact patterns including a first fixed contact pattern, a second fixed contact pattern and a common pattern to be paired with the first fixed contact pattern and the second fixed contact pattern; and
   a movable contact disposed above the fixed contact, the movable contact including first and second movable contact patterns arranged in a predetermined orientation, the first and second movable contact patterns conductively connecting the common pattern paired with the first fixed contact pattern and the second fixed contact pattern, respectively.

18. A switch apparatus in accordance with claim 17, wherein the common patterns are integrally formed in one piece 19. A switch apparatus in accordance with claim 17, wherein the plurality of the movable contact patterns are integrated in a single support member, each of the movable contact patterns being associated with one of the pairs of fixed contacts.

20. A switch apparatus in accordance with claim 17, further comprising an electronic keyboard instrument having a plurality of keys, wherein a pair of the fixed contact and the movable contact is provided on each of the keys, a plurality of the common patterns of a plurality of the fixed contacts for the associated keys being successively formed in the key arrangement direction, each of the common pattern of each of the fixed contacts being arranged in the direction of the length of each key.

21. A switch apparatus in accordance with claim 17, wherein one of the two rows of opposing comb-shaped fixed contact patterns includes the first fixed contact pattern and the common pattern that is separated from the first fixed contact pattern and the second fixed contact pattern.

22. A switch apparatus in accordance with claim 17, wherein one of the two rows of opposing comb-shaped fixed contact patterns includes the common pattern and the other of the tow rows of opposing comb-shaped fixed contact patterns includes the first fixed contact pattern and the second fixed contact pattern.

23. A switch apparatus in accordance with claim 17, further comprising an electronic keyboard apparatus having a plurality of keys, each of the plurality of keys defining a key length direction, wherein the two rows of opposing comb-shaped fixed contact patterns are arranged in the key length direction.

24. A switch apparatus in accordance with claim 17, further comprising an electronic keyboard apparatus having a plurality of keys, the plurality of keys defining a key arrangement direction, wherein a plurality of the two rows of opposing comb-shaped fixed contact patterns, each being associated with each of the plurality of keys, are successively arranged in the key arrangement direction.

25. A switch apparatus comprising:
   a fixed contact defining a center and including at least a first contact pattern, a second contact pattern and a common pattern disposed between the first contact pattern and the second contact pattern and separated from the first contact pattern and the second contact pattern by a predetermined distance, the first contact pattern having at least a first segment pattern radially extending across the center in a first direction and a second segment pattern radially extending across the center in a second direction transverse to the first direction; and
   a movable contact including a first movable contact that conductively connects the first contact pattern and the common pattern, and a second movable contact that conductively connects the second contact pattern and the common pattern.

26. A switch apparatus in accordance with claim 25, wherein each of the first contact pattern, the second contact pattern and the common pattern are formed by a comb-teeth shaped pattern, the comb-teeth shaped patterns of the first contact pattern and the second contact pattern being oppositely interlaced with the comb-teeth shaped pattern of the common pattern.

27. A switch apparatus in accordance with claim 25, further comprising an electronic keyboard apparatus having a plurality of keys, the plurality of keys defining a key arrangement direction, the common pattern being disposed at each of the keys, wherein a plurality of the common patterns are disposed successively in the key arrangement direction.

28. A switch apparatus in accordance with claim 25, further comprising an electronic keyboard apparatus having a plurality of keys, the plurality of keys defining a key arrangement direction, wherein a pair of the fixed contact and the movable contact is provided on each of the keys, a plurality of the common patterns of a plurality of the fixed contacts for the associated keys being continuously formed in the key arrangement direction, the common pattern of each of the fixed contacts being arranged in the direction of the length of each key.

29. A switch apparatus comprising:
a fixed contact including at least a first contact pattern, a second contact pattern and a common pattern disposed between the first contact pattern and the second contact pattern and separated from the first contact pattern and the second contact pattern by a predetermined distance; and a movable contact including a first movable contact that conductively connects the first contact pattern and the common pattern, and a second movable contact that conductively connects the second contact pattern and the common pattern, wherein the second movable contact contacts the first contact pattern, the second contact pattern and the common contact pattern of the fixed contact.

30. A switch apparatus comprising:
a printed substrate;
a fixed contact formed on the printed substrate, the fixed contact including a first comb-shaped pattern having a first teeth-pattern section, a second comb-shaped pattern having a second teeth-pattern section opposing the first teeth-pattern section of the first comb-shaped pattern, and a common pattern disposed between the first comb-shaped pattern and the second comb-shaped pattern, the common pattern having a center segment pattern and teeth-pattern sections on both sides thereof interlacing with the first comb-shaped pattern and the second comb-shaped pattern, respectively; and a movable contact disposed above the fixed contact, the movable contact including a first movable contact pattern for conductively connecting the first comb-shaped pattern and the common pattern, and a second movable pattern for conductively connecting the second comb-shaped patter and the common pattern.

31. A switch apparatus in accordance with claim 30, further comprising an electronic keyboard apparatus having a plurality of keys, the plurality of keys defining a key arrangement direction, wherein the center segment pattern of the common pattern extends in the key arrangement direction.

32. A switch apparatus in accordance with claim 30, further comprising an electronic keyboard apparatus having a plurality of keys, the plurality of keys defining a key arrangement direction, wherein the fixed contact includes a plurality of the first comb-shaped patterns, a plurality of the second comb-shaped patterns, and a plurality of the movable contacts, each one of the first comb-shaped patterns, the second comb-shaped patterns and the movable contacts being associated with each one of the keys.

33. A switch apparatus comprising:
a fixed contact defining a center and including at least a generally cross-shaped internal contact pattern disposed at the center, an external contact pattern separated from the cross-shaped internal contact pattern, and a common contact pattern to be paired with and disposed between the internal cross-shaped contact pattern and the external contact pattern, the common contact pattern generally defining a cross-shaped pattern encircling the cross-shaped internal contact pattern; and a movable contact including a first movable contact that conductively connects the internal contact pattern and the common pattern, and a second movable contact that conductively connects the external contact pattern and the common pattern.

\* \* \* \* \*